(12) United States Patent
Souvignier et al.

(10) Patent No.: US 7,281,190 B2
(45) Date of Patent: Oct. 9, 2007

(54) RUNNING DIGITAL SUM CODING SYSTEM

(75) Inventors: Thomas Victor Souvignier, Longmont, CO (US); Cenk Argon, Madison, WI (US)

(73) Assignee: Seagate Technology LLC, Scotts Valley, CA (US)

( * ) Notice: Subject to any disclaimer, the term of this patent is extended or adjusted under 35 U.S.C. 154(b) by 571 days.

(21) Appl. No.: 10/978,338

(22) Filed: Nov. 1, 2004

(65) Prior Publication Data
US 2006/0095828 A1  May 4, 2006

(51) Int. Cl.
*H03M 13/29* (2006.01)

(52) U.S. Cl. .......................... 714/755; 341/58; 341/59; 341/94; 714/769

(58) Field of Classification Search ............ 341/58–59, 341/94; 714/755, 769
See application file for complete search history.

(56) References Cited

U.S. PATENT DOCUMENTS

| | | | |
|---|---|---|---|
| 5,691,993 A | 11/1997 | Fredrickson | 371/38.1 |
| 5,938,790 A | 8/1999 | Marrow | 714/795 |
| 6,105,159 A | 8/2000 | Frederickson | 714/762 |
| 6,233,289 B1 | 5/2001 | Fredrickson | 375/341 |
| 6,343,101 B1 | 1/2002 | Dong et al. | 375/242 |
| 6,347,390 B1 | 2/2002 | Ino | 714/792 |
| 6,463,103 B1 | 10/2002 | Dong et al. | 375/242 |
| 2002/0016943 A1 | 2/2002 | Hunt | 714/755 |
| 2004/0061964 A1* | 4/2004 | Akamatsu | 360/39 |
| 2005/0066261 A1* | 3/2005 | Morita et al. | 714/800 |

OTHER PUBLICATIONS

Fang, Z. et al.; Joint Turbo Channel Detection and RLL Decoding for (1,7) Coded Partial Response Recording Channels; Communications, 2003. ICC '03. IEEE International Conference on; vol. 4, May 11-15, 2003 pp. 2919-2923□□.*

* cited by examiner

*Primary Examiner*—R. Stephen Dildine
(74) *Attorney, Agent, or Firm*—Westman Champlin & Kelly, P.A.

(57) ABSTRACT

A communication system includes an encoder that receives user data and includes running digital sum encoding and turbo encoding. The running digital sum encoding is preserved in an encoder output to a channel. A decoder receives a channel output and comprises running digital sum decoding and turbo decoding to reproduce the user data in a decoder output.

30 Claims, 9 Drawing Sheets

$$H = \begin{bmatrix}
1 & 1 & 1 & 1 & 1 & 0 & 0 & 0 & 0 & 0 & 0 & 0 & 0 & 0 & 0 & 0 & 0 & 0 & 0 & 0 & 0 & 0 & 0 & 0 & 0 \\
0 & 0 & 0 & 0 & 0 & 1 & 1 & 1 & 1 & 1 & 0 & 0 & 0 & 0 & 0 & 0 & 0 & 0 & 0 & 0 & 0 & 0 & 0 & 0 & 0 \\
0 & 0 & 0 & 0 & 0 & 0 & 0 & 0 & 0 & 0 & 1 & 1 & 1 & 1 & 1 & 0 & 0 & 0 & 0 & 0 & 0 & 0 & 0 & 0 & 0 \\
0 & 0 & 0 & 0 & 0 & 0 & 0 & 0 & 0 & 0 & 0 & 0 & 0 & 0 & 0 & 1 & 1 & 1 & 1 & 1 & 0 & 0 & 0 & 0 & 0 \\
0 & 0 & 0 & 0 & 0 & 0 & 0 & 0 & 0 & 0 & 0 & 0 & 0 & 0 & 0 & 0 & 0 & 0 & 0 & 0 & 1 & 1 & 1 & 1 & 1 \\
1 & 0 & 0 & 0 & 0 & 1 & 0 & 0 & 0 & 0 & 1 & 0 & 0 & 0 & 0 & 1 & 0 & 0 & 0 & 0 & 1 & 0 & 0 & 0 & 0 \\
0 & 1 & 0 & 0 & 0 & 0 & 1 & 0 & 0 & 0 & 0 & 1 & 0 & 0 & 0 & 0 & 1 & 0 & 0 & 0 & 0 & 1 & 0 & 0 & 0 \\
0 & 0 & 1 & 0 & 0 & 0 & 0 & 1 & 0 & 0 & 0 & 0 & 1 & 0 & 0 & 0 & 0 & 1 & 0 & 0 & 0 & 0 & 1 & 0 & 0 \\
0 & 0 & 0 & 1 & 0 & 0 & 0 & 0 & 1 & 0 & 0 & 0 & 0 & 1 & 0 & 0 & 0 & 0 & 1 & 0 & 0 & 0 & 0 & 1 & 0 \\
0 & 0 & 0 & 0 & 1 & 0 & 0 & 0 & 0 & 1 & 0 & 0 & 0 & 0 & 1 & 0 & 0 & 0 & 0 & 1 & 0 & 0 & 0 & 0 & 1
\end{bmatrix}$$

FIG. 8

$$H = \begin{bmatrix}
1 & 0 & 0 & 0 & 1 & 0 & 0 & 0 & 0 & 1 & 0 & 0 & 0 & 0 & 1 & 0 & 0 & 0 & 0 & 1 & 0 & 0 & 0 & 0 & 0 \\
0 & 1 & 0 & 0 & 0 & 0 & 1 & 0 & 0 & 0 & 1 & 0 & 0 & 0 & 0 & 1 & 0 & 0 & 0 & 0 & 1 & 0 & 0 & 0 & 0 \\
0 & 0 & 1 & 0 & 0 & 0 & 0 & 1 & 0 & 0 & 0 & 0 & 1 & 0 & 0 & 0 & 1 & 0 & 0 & 0 & 0 & 1 & 0 & 0 & 0 \\
0 & 0 & 0 & 1 & 0 & 0 & 0 & 0 & 1 & 0 & 0 & 0 & 0 & 1 & 0 & 0 & 0 & 0 & 1 & 0 & 0 & 0 & 1 & 0 & 0 \\
0 & 0 & 0 & 0 & 0 & 1 & 0 & 0 & 0 & 0 & 0 & 1 & 0 & 0 & 0 & 0 & 0 & 1 & 0 & 0 & 0 & 0 & 0 & 1 & 1 \\
\hline
1 & 0 & 0 & 0 & 0 & 1 & 1 & 0 & 0 & 0 & 0 & 0 & 1 & 0 & 0 & 0 & 0 & 0 & 1 & 0 & 0 & 0 & 0 & 0 & 0 \\
0 & 1 & 0 & 0 & 0 & 0 & 0 & 1 & 0 & 0 & 0 & 1 & 0 & 1 & 0 & 0 & 0 & 0 & 0 & 1 & 0 & 0 & 0 & 0 & 0 \\
0 & 0 & 1 & 0 & 0 & 0 & 0 & 0 & 1 & 0 & 0 & 0 & 0 & 0 & 1 & 0 & 0 & 1 & 0 & 0 & 1 & 0 & 0 & 0 & 0 \\
0 & 0 & 0 & 1 & 0 & 0 & 0 & 0 & 0 & 1 & 0 & 0 & 0 & 0 & 0 & 1 & 0 & 0 & 0 & 0 & 0 & 1 & 0 & 1 & 0 \\
0 & 0 & 0 & 0 & 1 & 0 & 0 & 0 & 0 & 0 & 1 & 0 & 0 & 0 & 0 & 0 & 1 & 0 & 0 & 0 & 0 & 0 & 1 & 0 & 1
\end{bmatrix}$$

Rows: $c_1, c_2, \ldots, c_{10}$. Columns: $x_1, x_2, \ldots, x_{25}$.

FIG. 10

RUNNING DIGITAL SUM CODING SYSTEM

FIELD OF THE INVENTION

The present invention relates generally to encoding data for a channel, and more particularly but not by limitation to encoding that provides error correction and reduces low frequency content of encoded data.

BACKGROUND OF THE INVENTION

Data that is read back from perpendicular magnetic recordings includes a significant amount of low frequency (DC) energy (long runs of ones (+1) or zeros (−1)). When this information passes through a read channel, the read channel tends to filter out much of this low frequency information. The long runs of 1's or 0's in user data introduce undesired low frequency components into a read channel amplifier system that is optimized for amplifying higher frequencies. Running digital sum (RDS) encoding of the user data can remove the long runs, but when RDS encoding is combined with random interleaving and turbo encoding for error correction, the RDS encoding is destroyed, and the benefits of RDS in removing low frequency components are not realized as data passes through the read/write process.

Embodiments of the present invention provide solutions to these and other problems, and offer other advantages over the prior art.

SUMMARY OF THE INVENTION

Disclosed is a communication system that comprises an encoder and a decoder. The encoder receives user data and provides an encoder output that comprises running digital sum encoding and turbo encoding. The running digital sum encoding is preserved in the encoder output.

A channel receives the encoder output and provides a channel output to the decoder. The decoder provides a decoder output that comprises running digital sum decoding and turbo decoding to reproduce the user data.

Other features and benefits that characterize embodiments of the present invention will be apparent upon reading the following detailed description and review of the associated drawings.

BRIEF DESCRIPTION OF THE DRAWINGS

FIGS. 7-10 illustrate an alternate graphical presentation of combined interleaving and turbo encoding that is equivalent to that shown in FIG. 6.

DETAILED DESCRIPTION OF ILLUSTRATIVE EMBODIMENTS

Figure 1:
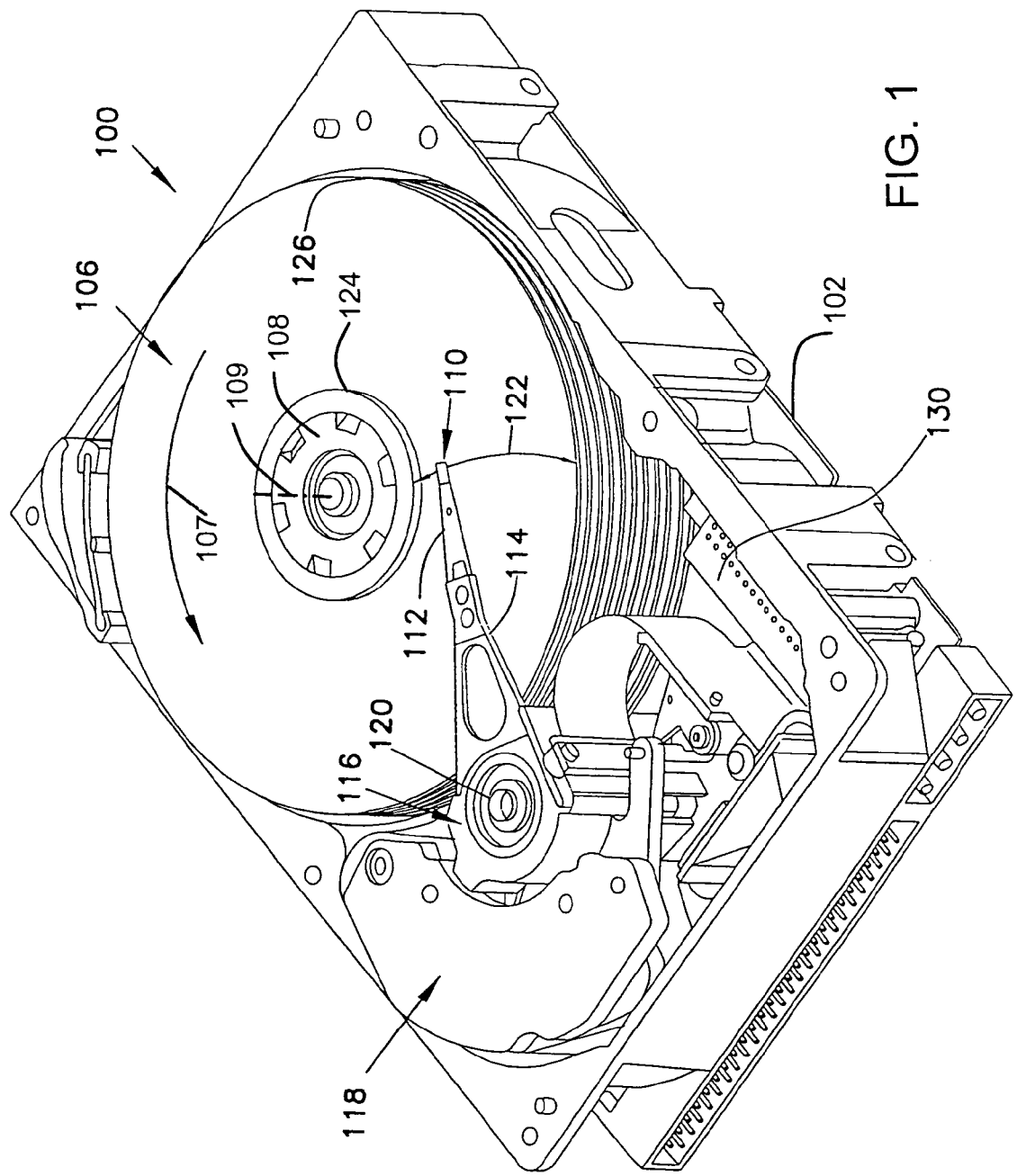
FIG. 1 is an oblique view of a disc drive communication system.

Long runs of ones (+1) or zeros (−1) that are read back from perpendicular magnetic recordings contain low frequency content that tends to be filtered out by read channel amplifiers, resulting in a loss of user data. When this information passes through a read channel amplifier that is optimized for a higher frequency passband, the read channel preamplifier tends to filter out much of this low frequency information.

In order to encode the data to reduce the low frequency content, a running digital sum (RDS) constraint process is included in a magnetic recording system that has turbo encoding, random interleaving and soft output Viterbi algorithm (SOVA) detection. Turbo coding corrects errors that result from transmission of digital data through a noisy communication channel. Turbo coding refers to specific methods of encoding and decoding digital data that result in very little loss of channel capacity due to the coding and very low bit error rates. When the RDS constraint is simply added before the turbo encoder in this system, the result is unsuccessful because the turbo encoding and random interleaving prevent the RDS constraint from reaching the read/write process (channel).

For a binary sequence of user input data:

$$\{x_i\} = \{\ldots, x_{-1}, x_0, \ldots, x_i, \ldots\}, x_i \in \{-1, 1\} \quad \text{Equation 1}$$

the running digital sum (RDS) Z, is defined as $$z_i = \sum_{j=-\infty}^{i} x_j = z_{i-1} + x_i \quad \text{Equation 2}$$

When the RDS constraint is set to $z_i = \pm 3$, for example, each codeword has a difference between the number of +1's and −1's that does not exceed 3. Similarly, when the RDS constraint is set to $z_i = 0$, for example each codeword has the same number of +1's and −1's.

User data (data to be written) is first encoded with the RDS constraint. The RDS-encoded codewords are next encoded with a turbo encoder (the turbo encoder could be a TPC encoder, an LDPC encoder, or any other encoder), and finally passed through an interleaver ($\pi$) that permutes the input sequence of the interleaver in some fashion. After the encoded user data from the interleaver passes through the read/write process (or channel), the encoded user data is decoded. The encoded user data passes through a soft-output Viterbi algorithm (SOVA) (or some other soft-output channel decoder). The output from the SOVA is next de-interleaved ($\pi^{-1}$) and turbo decoded. At this point, the data can be passed through the interleaver, SOVA, de-interleaver, and turbo decoder multiple times (iterations) to improve performance. Finally, the data is RDS decoded before being presented as user data (read from the disc drive). In the configuration described above, the turbo encoder and random interleaver destroy the RDS constraint, rendering the RDS encoder useless.

Disclosed below in connection with FIGS. 1-10, are methods and apparatus for communication systems (applicable to data storage devices as well as other communication channels) that provide a combination of RDS constraint and turbo encoding while allowing the RDS encoding to reach and pass through the channel intact. The RDS constrained data avoids the problem of long strings of bits of the same polarity. Problems with filtering out low frequency content and loss of data at the read preamplifier are avoided.

FIG. 1 is an oblique view of a disc drive 100 in which embodiments of the present invention are useful. Disc drive 100 includes a housing with a base 102 and a top cover (not shown). Disc drive 100 further includes a disc pack 106, which is mounted on a spindle motor (not shown) by a disc clamp 108. Disc pack 106 includes one or more individual discs, which are mounted for co-rotation about central axis 109 in a direction 108. Each disc surface has an associated disc head slider 110 which is mounted to disc drive 100 for communication with the disc surface. In the example shown in FIG. 1, sliders 110 are supported by suspensions 112 which are in turn attached to track accessing arms 114 of an actuator 116. The actuator shown in FIG. 1 is of the type known as a rotary moving coil actuator and includes a voice coil motor (VCM), shown generally at 118. Voice coil motor 118 rotates actuator 116 with its attached heads 110 about a pivot shaft 120 to position heads 110 over a desired data track along an arcuate path 122 between a disc inner diameter 124 and a disc outer diameter 126. Voice coil motor 118 is driven by servo electronics 130 based on signals generated by heads 110 and a host computer (not shown). The electronics 130 is explained in more detail below in connection with examples shown in FIGS. 2-10. Disc drive 100 comprises a first embodiment of a communication system.

Figure 2:
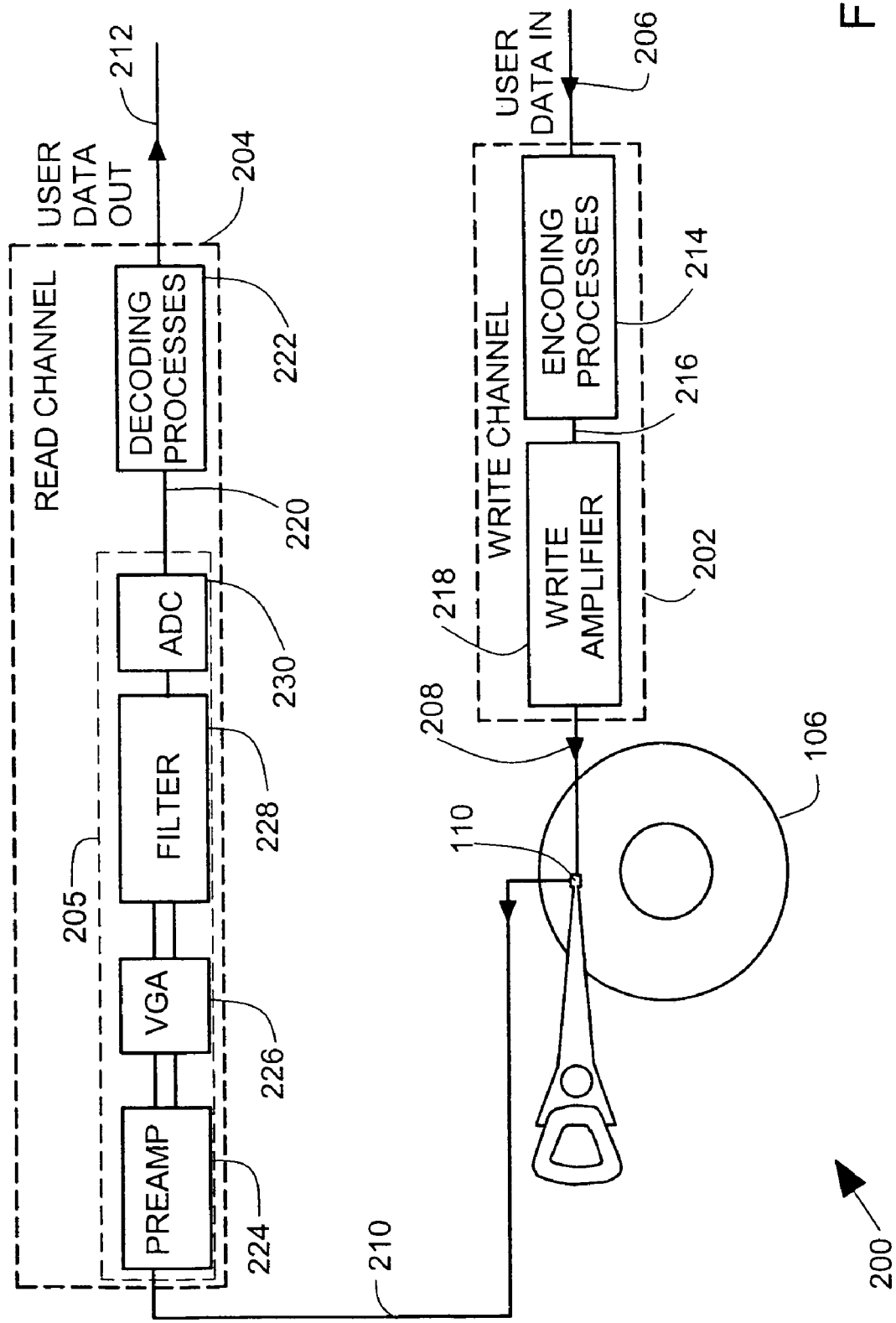
FIG. 2 illustrates a block diagram of the disc drive in FIG. 1.

FIG. 2 illustrates a block diagram 200 of the disc drive 100 described above in connection with FIG. 1. The block diagram 200 illustrates communication channel features of the disc drive 100. Reference numbers used in FIG. 2 that are the same as reference numbers used in FIG. 1 identify the same or similar features.

In addition to many other disc drive support circuits (not illustrated), the electronics 130 (FIG. 1) includes a write channel 202 and a read channel 204. The write channel 202 receives user data input 206 from a host computer and provides encoded user data 208 (as a write current) to a write head portion (not separately illustrated) of the slider 110. The write head portion records encoded user data 208 on the disc 106. The read channel 204 receives encoded user data 210 from a read head portion (not separately illustrated) of the slider 110 and provides user data output 212 to the host computer. The read head portion reads encoded user data 210 from the disc 106. The slider 110 and disc 106 function as a communication medium with a variable channel delay between input (read) and output (write).

The write channel 202 comprises an encoder 214 that performs encoding processes on the user data input 206 and provides an encoder output 216 to a write amplifier 218. The write amplifier 218 generates a write current that represents the encoded user data 208.

The read channel 204 comprises multiple cascaded stages 205 that process the encoded user data 210 and that provide processed encoded user data 220 to a decoder 222. The decoder 222 generates the user data output 212. The multiple cascaded stages 205 comprise a preamplifier 224, a variable gain amplifier (VGA) 226, a filter 228 and an analog-to-digital converter (ADC) 230. The multiple cascaded stages 205 have a transfer function that comprises a bandpass filter that selectively filters out signals at lower frequencies such as long strings of either ones (+1) or zeros (−1). The encoder 214 includes a running digital sum (RDS) encoding process combined with a turbo encoding process to precludes long strings of ones and zeros as encoded data passes through the read/write process. The encoder 214 and the decoder 222 are explained in more detail below by way of examples illustrated in FIGS. 3-10.

Figure 3:
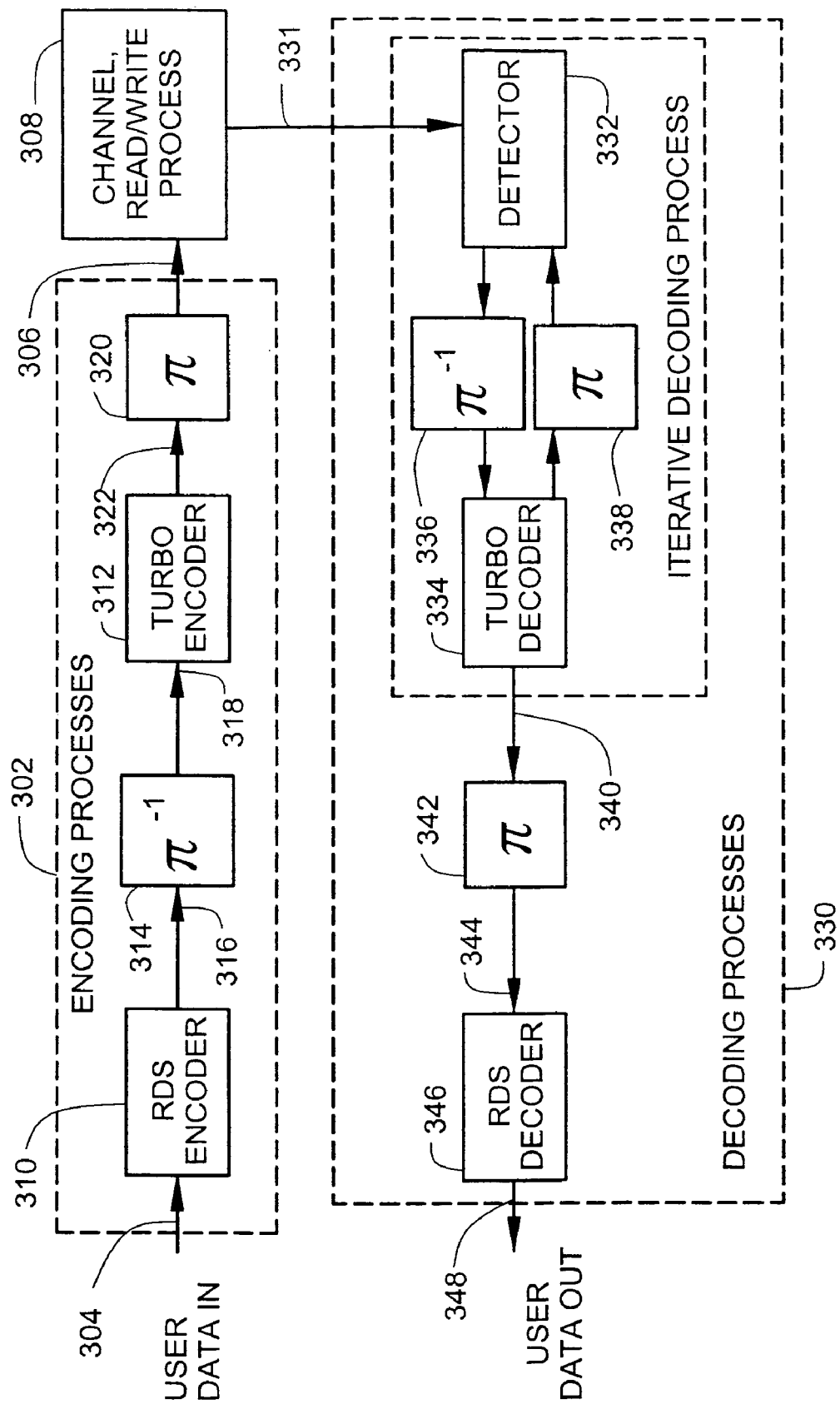
FIG. 3 illustrates a second embodiment of a communication system.

FIG. 3 illustrates a second embodiment of a communication system 300. The communication system 300 includes an encoder 302 that receives input user data 304 and that provides an encoder output 306 to a channel 308. The term "channel" as used here includes a communication medium (such as a cable, bus or read/write process) as well as so-called physical layer circuits (drivers, receivers, amplifiers and the like) that interface with the medium. The channel 308 comprises a noisy communication channel that filters out low frequency components of the encoder output 306. The encoder 302 includes an RDS encoder 310 that provides encoding that reduces low frequency components. The encoder 302 also includes a turbo encoder 312 that provides encoding for error correction that overcomes channel noise.

The encoder 302 comprises a de-interleaver ($\pi^{-1}$) 314 that receives an RDS encoded output 316 and that generates a de-interleaved output 318 that couples to the turbo encoder 312. The encoder 302 also comprises an interleaver ($\pi$) 320 that receives a turbo encoder output 322 and generates the encoder output 306. The interleaver ($\pi$) 320 and the de-interleaver ($\pi^{-1}$) 314 preferably have inverse functions. Interleaving is conventionally used to scramble a write data stream of encoded bits into a new sequence such that bursts of noise introduced by passage through the noisy channel are broken up and spread out by subsequent de-interleaving. Errors that are spread out are more easily corrected than errors that are close together in a burst. In the communication system illustrated in FIG. 3, however, an RDS encoded output 316 is first de-interleaved by de-interleaver 314, then passed through turbo encoder 312 and then interleaved by interleaver 320 to preserve the RDS encoding at the encoder output 306 in spite of the turbo encoding process performed by turbo encoder 312. The encoder output 306 is both turbo encoded and running digital sum encoded through the use of de-interleaver 314 and interleaver 320.

The RDS constraint is preserved intact in the encoder output 306 and low frequency components are absent when encoded data passes through the channel 308. The low frequency stop band of the channel does not interfere with the encoded data. The turbo encoding is preserved intact when the encoded data passes through the channel 308. The turbo encoding is available for error correction in a decoder 330.

Placing the de-interleaver 314 between the RDS encoder 310 and the turbo encoder 312 permits the RDS constraint (or other constraints) to reach the channel 308. The de-interleaver 314 is followed in the cascaded encoding processes by its corresponding interleaver 320 (or vice versa) and the interleaving is not present in the encoder output 306. Placing a systematic coder (such as turbo encoder 312) between the de-interleaver 314 and the interleaver 320 has no undesirable effect on the user information bits in the data words.

The decoder 330 comprises a detector 332 that receives a channel output (encoded data) 331 from the channel 308 that sometimes includes bursts of noise. The RDS encoding is preserved in the channel output 331. The detector 332 comprises a soft output Viterbi algorithm (SOVA) or other soft output channel detector. The detector 332 couples to a turbo decoder 334 through a de-interleaver 336 and an interleaver 338. The detector 332 and the turbo decoder 334 iteratively decode the stream of data and provide a turbo decoder output 340. The turbo decoder output 340 couples to an interleaver 342 in the decoder 330. The interleaver 342 provides an interleaver output 344 that couples to an RDS decoder 346. The RDS decoder 346 generates a user data output 348. The user data output 348 is a reproduction of the user data input 304. The user data output 348 is error corrected for errors introduced by the channel 308, RDS decoded, and is free from loss of data due to the low frequency stop characteristics of the channel 308.

Figure 4:
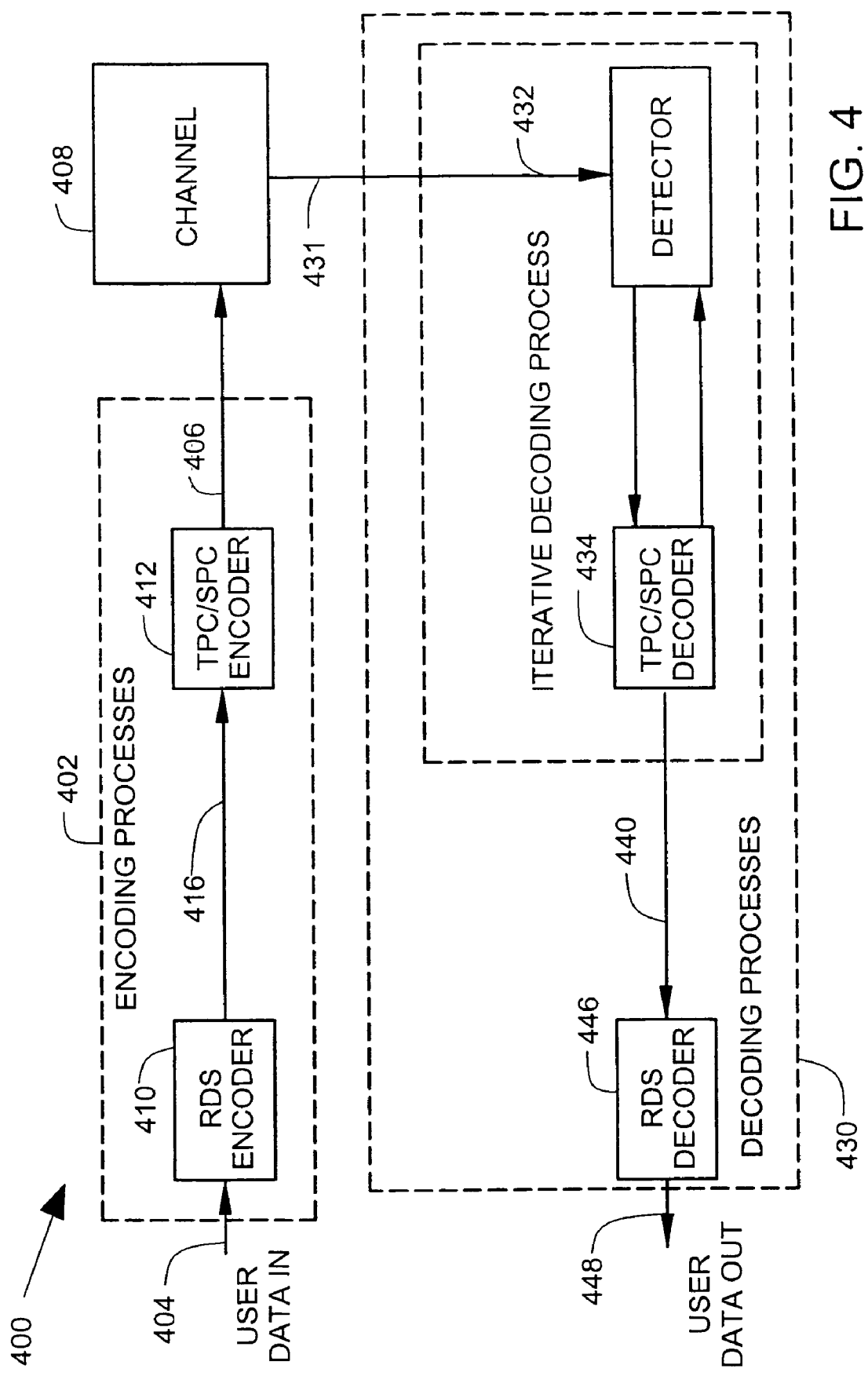
FIG. 4 illustrates a third embodiment of a communication system.

FIG. 4 illustrates a third embodiment of a communication system 400. The communication system 400 includes an encoder 402 that receives input user data 404 and that provides an encoder output 406 to a channel 408. The channel 408 comprises a noisy communication channel that filters out low frequency components of the encoder output 406. The encoder 402 includes a turbo product and single parity check encoder (TPC/SPC) 412 that adds a single parity check bit and provides encoding for error correction to overcome channel noise. The encoder 402 also includes an RDS encoder 410 that provides encoding that reduces low frequency components. The RDS encoder 410 provides an RDS encoder output to the TPC/SPC encoder 412. The TPC/SPC encoder 412 provides the encoder output 406.

The addition of parity bits in the TPC/SPC encoder 412 does not maintain the RDS constraint, and this is resolved by placing one turbo parity bit at the end of each RDS codeword, and relaxing the RDS constraint by one. For example, if an RDS code with a constraint $z_i=\pm 3$ is used, the RDS constraint after the turbo encoder is increased by one so that $z_i=\pm 4$ after the turbo encoder. Aside from the minimal impact of slightly relaxing the RDS constraint, this solution results in no performance degradation to iterative decoding processes.

A decoder 430 comprises a detector 432 that receives encoded data 431 from the channel 408 that sometimes includes bursts of noise. The detector 432 comprises a soft output Viterbi algorithm (SOVA) or other soft output channel detector. The detector 432 couples to a TPC/SPC decoder 434. The detector 432 and the turbo decoder 434 iteratively decode the stream of data and provide a TPC/SPC decoder output 440. The TPC/SPC decoder output 340 couples to an RDS decoder 446. The RDS decoder 446 generates a user data output 448. The user data output 448 is a reproduction of the user data input 404. The user data output 448 is error corrected for errors introduced by the channel 408, and is free from loss of data due to the low frequency stop characteristics of the channel 408.

In communication system 400, there are no interleavers or de-interleavers, thus ensuring that that the RDS constraint passes through the channel 408 intact. The communication system 400, which does not have interleavers, performs at a relatively slow speed in comparison with communication systems that include interleavers. Speed can be increased by incorporating interleaving within the TPC/SPC encoder and by incorporating de-interleaving with the TPC/SPC decoder as explained below in connection with a fourth embodiment illustrated in FIGS. 5-10.

Figure 5:
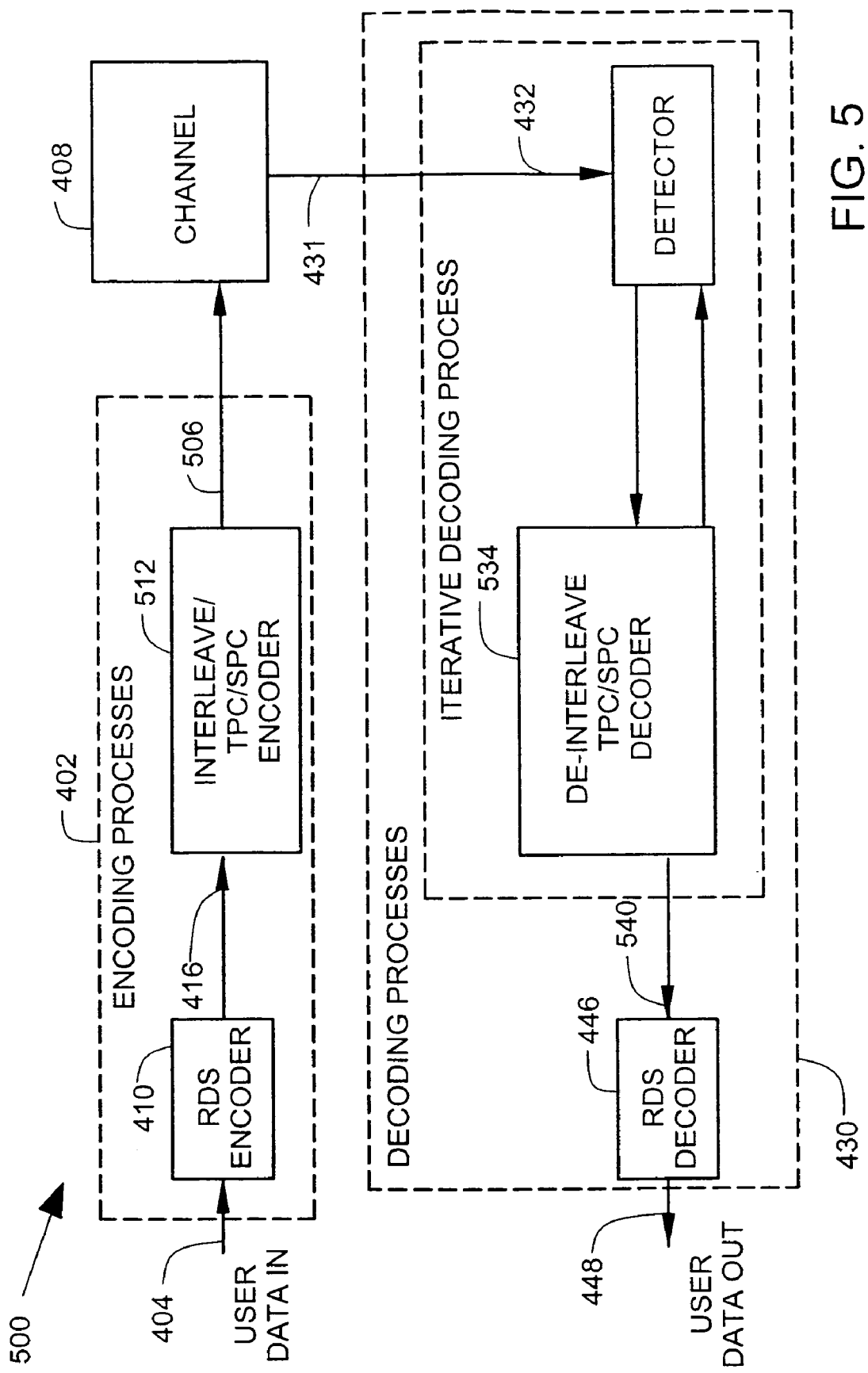
FIG. 5 illustrates a fourth embodiment of a communication system.

FIG. 5 illustrates a fourth embodiment of a communication system 500. The communication system 500 is similar to the communication system 400 (FIG. 4), and reference numbers used in FIG. 5 that are the same as reference numbers used in FIG. 4 identify the same or similar features, and for the sake of brevity, the description of these features is not repeated in the description of FIG. 5.

In FIG. 5, a combined interleaver and TPC/SPC encoder 512 provides an encoder output 506 to the channel 408, while in FIG. 4, a TPC/SPC encoder 412 provides an encoder output 406 to the channel 408. In FIG. 5, a combined de-interleaver and TPC/SPC decoder 534 provides an output 540 to the RDS decoder 446, while in FIG. 4, a TPC/SPC decoder 434 provides an output 440 to the RDS decoder 446. In other respects, the communication system 500 in FIG. 5 is similar to the communication system 400 in FIG. 4. The manner in which interleaving is combined with TPC/SPC encoding in encoder 512 is explained in more detail below by way of examples illustrated in FIGS. 6-10.

In ordinary TPC/SPC systems, a single parity bit is calculated for each row and each column of a k×k matrix of user information bits to form a matrix of (k+1)×(k+1) bits of single parity encoded information. This matrix is then passed on to a random interleaver to break the dependency on row bits. The random interleaver performs a horizontal encoding procedure selects bits from different rows using the following algorithm:

for $i=0: k-1$                                                 Equation 3 for $j=0: k-1$                                             Equation 4

$a_{ik}=(a_{ik}+a_{j,(i-j)\bmod k})\bmod 2$                 Equation 5

The output of the random interleaver does not preserve any RDS constrain that was in the k×k matrix of user information and hence any RDS information is lost in conventional TPC/SPC systems.

Figure 6:
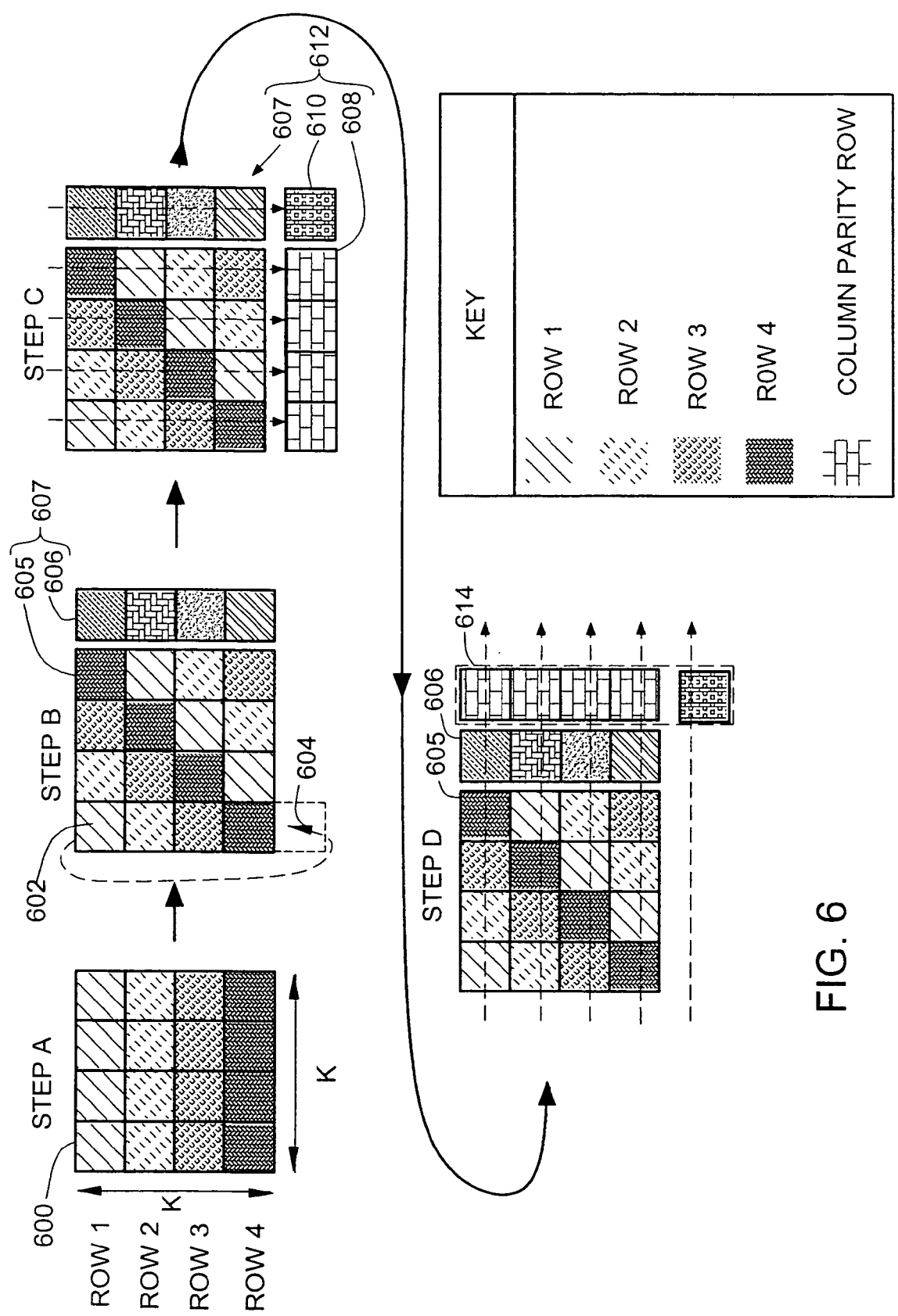
FIG. 6 illustrates steps in a process of combining interleaving with turbo encoding.

FIG. 6 illustrates sequential steps A, B, C, D in a process of combining interleaving with TPC/SPC encoding in a way that, unlike conventional TPC/SPC systems, preserves RDS constraints at the encoder output in FIG. 5. At step A in FIG. 6, an exemplary RDS constrained 4×4 matrix 600 of user data (output 416 in FIG. 5) is illustrated. The 4×4 matrix 600 is merely exemplary, and any practical sized matrix can be used. RDS constrained data in each horizontal row at step A is identified by a row graphical patterns as shown in the KEY table in FIG. 6.

At step B in FIG. 6, the encoder 512 (FIG. 5) has performed interleaving on the 4×4 matrix 600 at step A to generate an interleaved 4×4 matrix 605 illustrated at step B. The interleaving is performed in an ordered way that displaces successive matrix elements in a row by one row for each successive column to form generally diagonal patterns of elements taken from a particular row at step A. For example, row 4 elements from matrix 600 (step A) are along a major diagonal of matrix 605 (step) B. In another example, row 1 elements taken from matrix 600 (step A) are along a diagonal on matrix 605 (step) B when an element 602 that would be displaced beyond the limits of the matrix 605 on a top side is considered to wrap to an opposite side of the matrix 605 as illustrated at 604. Also, at step B, row parity check bits 606 are added, forming a k×(k+1) matrix 607 at step B.

At step C, column parity check bits 608 and corner check bit 610 are added to matrix 607 to form a (k+1)×(k+1) matrix 612 at step C. Finally, at step D, the column parity check row 608 and the corner check bit 610 are removed and rearranged in a column 614. At step D, there is a k×(k+2) matrix with a trailing corner check bit 610. At step D, there is a successful combination of interleaving and adding parity checks for turbo encoding, with the interleaving preserved as the turbo encoding is done. This procedure ensures that each RDS encoded user information bit is involved exactly twice during parity calculations (as it is for standard TPC/SPC).

Each row in the matrix 612, except the last row (608 and 610), now maintains an RDS constraint. The last row is converted to an extra column at step D, so an RDS constraint is maintained for each row. As in the general scheme, the RDS constraint is relaxed slightly. In this method, the RDS constraint is relaxed by two, since there are two unconstrained parity bits on each row. Now when the information is written row-wise to the media, the original RDS constraint +2 is maintained.

Figures 7, 9:
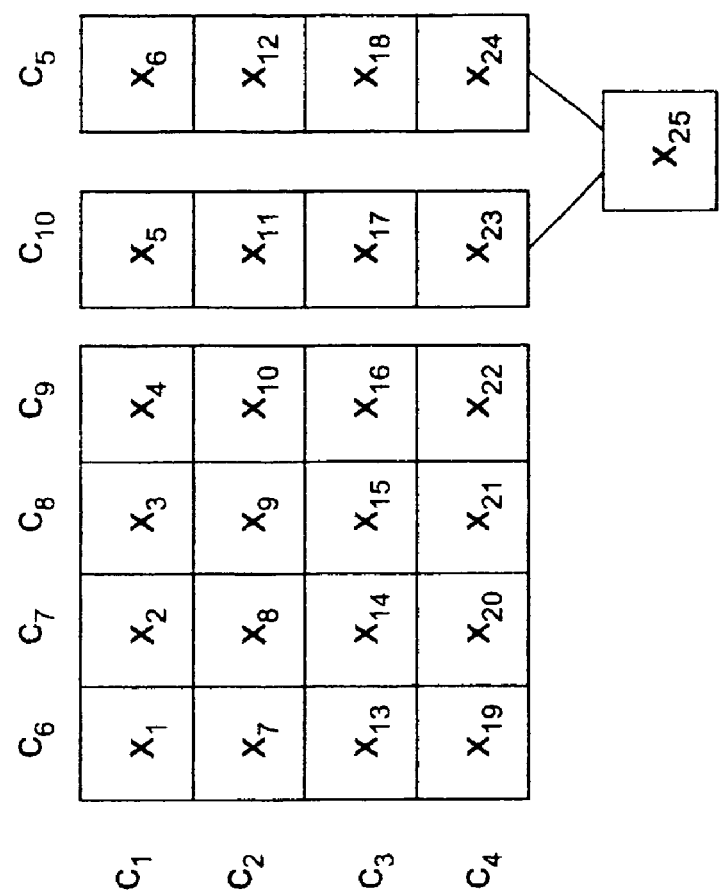

FIGS. 7-10 provide an alternate graphical presentation of combined interleaving and turbo encoding that is equivalent to that shown in FIG. 6. Since a general TPC/SPC code can be viewed as a structured low-density parity-check (LDPC) code, this method can be viewed as a less-structured LDPC code. Consider the $(5,4)^2$ TPC/SPC code 700 depicted FIG. 7, where the last row and column are the parity bits, and element X25 is a corner parity bit. FIG. 7 is comparable to step C in FIG. 6. The corresponding parity check matrix H is shown in FIG. 8. The proposed $(5,4)^2$ TPC/SPC code is depicted in FIG. 9. FIG. 9 is comparable to step D in FIG. 6. A parity check matrix corresponding with FIG. 9 is shown in FIG. 10.

Though the proposed TPC/SPC approach can be viewed as a very efficient way of implementing a regular LDPC code with column weight 2, the H matrix does not need to be stored, offering significant reductions in complexity.

It is to be understood that even though numerous characteristics and advantages of various embodiments of the invention have been set forth in the foregoing description, together with details of the structure and function of various embodiments of the invention, this disclosure is illustrative only, and changes may be made in detail, especially in matters of structure and arrangement of parts within the principles of the present invention to the full extent indicated by the broad general meaning of the terms in which the appended claims are expressed. For example, the particular elements may vary depending on the particular application for the communication system while maintaining substantially the same functionality without departing from the scope of the present invention. In addition, although a preferred embodiment described herein is directed to a read/write process for a data storage system, it will be appreciated by those skilled in the art that the teachings of the present invention can be applied to other communication channels, without departing from the scope of the present invention.

What is claimed is:

1. A communication system, comprising:
   an encoder that receives user data and provides an encoder output that comprises running digital sum encoding, and turbo encoding, the running digital sum encoding being preserved in the encoder output;
   a channel receiving the encoder output and providing a channel output; and
   a decoder that receives the channel output and provides a decoder output that comprises running digital sum decoding and turbo decoding to reproduce the user data.

2. The communication system of claim 1 wherein the encoder comprises a de-interleaver and an interleaver that preserve the running digital sum encoding.

3. The communication system of claim 2 wherein the interleaver comprises an ordered interleaver.

4. The communication system of claim 2 wherein the turbo decoding comprises a de-interleaver and an interleaver that preserve the running digital sum encoding.

5. The communication system of claim 1 wherein the encoder comprises a combined turbo encoder and interleaver that preserves the running digital sum encoding in the turbo encoding.

6. The communication system of claim 5 wherein the combined turbo encoder comprises single parity check encoding.

7. The communication system of claim 1 wherein the encoder comprises part of a write channel and the decoder comprises part of a read channel in a data storage device.

8. The communication system of claim 7 wherein the data storage device comprises a disc drive.

9. The communication system of claim 1 wherein the channel comprises a bus.

10. The communication system of claim 1 wherein the running-digital-sum encoding comprises an encoder running-digital-sum constraint, the running digital sum decoding comprises a decoder running-digital-sum constraint; and the decoder running-digital-sum constraint is relaxed relative to the encoder running-digital-sum constraint.

11. A communication system, comprising:
    encoder means that receive user data and provides an encoder output for running-digital-sum encoding, and turbo encoding, while preserving the running digital sum encoding in the encoder output;
    a channel receiving the encoder output and providing a channel output; and
    decoder means that receive the channel output and provide a decoder output for running digital sum decoding and turbo decoding to reproduce the user data.

12. The communication system of claim 11 wherein the encoder comprises a de-interleaver and an interleaver that preserve the running digital sum encoding.

13. The communication system of claim 12 wherein the interleaver comprises an ordered interleaver.

14. The communication system of claim 12 wherein the turbo decoding comprises a de-interleaver and an interleaver that preserve the running digital sum encoding.

15. The communication system of claim 11 wherein the encoder comprises a combined turbo encoder and interleaver that preserves the running digital sum encoding in the turbo encoding.

16. The communication system of claim 15 wherein the combined turbo encoder comprises single parity check encoding.

17. The communication system of claim 11 wherein the encoder is part of a write channel and the decoder is part of a read channel in a data storage device.

18. The communication system of claim 17 wherein the data storage device comprises a disc drive.

19. The communication system of claim 11 wherein the channel comprises a bus.

20. The communication system of claim 11 wherein the running digital sum encoding in the encoder comprises an encoder running digital sum constraint, and the running digital sum decoder comprises a decoder running digital sum constraint, and the decoder running digital sum constraint is relaxed relative to the encoder running digital sum constraint.

21. A communication method, comprising:
    encoding user data with running digital sum and turbo encoding, and providing an encoder output in which the running digital sum encoding is preserved;
    passing the encoder output through a channel to provide a channel output; and
    decoding the channel output with turbo decoding and running digital sum decoding to provides a decoder output that reproduces the user data.

22. The communication method of claim 21 wherein the encoding comprises de-interleaving and an interleaving to preserve the running digital sum encoding.

23. The communication method of claim 22 wherein the interleaving comprises ordered interleaving.

24. The communication method of claim 22 wherein the turbo decoding comprises de-interleaving and interleaving to preserve the running digital sum encoding.

25. The communication method of claim 21 wherein the encoding comprises combining turbo encoding and interleaving to preserve the running digital sum encoding.

26. The communication method of claim 25 wherein the combined turbo encoder comprises single parity check encoding.

27. The communication method of claim 21 wherein the encoder is part of a write channel and the decoder is part of a read channel in a data storage device.

28. The communication method of claim 27 wherein the data storage device comprises a disc drive.

29. The communication method of claim 21 wherein the channel comprises a bus.

30. The communication method of claim 21 wherein the running digital sum encoding in the encoder comprises an encoder running digital sum constraint, and the running digital sum decoder comprises a decoder running digital sum constraint, and the decoder running digital sum constraint is relaxed relative to the encoder running digital sum constraint.

* * * * *